United States Patent [19]

Jung et al.

[11] Patent Number: 5,656,976

[45] Date of Patent: Aug. 12, 1997

[54] HYBRID FREQUENCY SYNTHESIZER

[75] Inventors: Young-Ju Jung; Young-Ok Park, both of Daejeon, Rep. of Korea

[73] Assignee: Electronics and Telecommunications Research Institute, Daejeon, Rep. of Korea

[21] Appl. No.: 522,702

[22] Filed: Sep. 1, 1995

[30] Foreign Application Priority Data

Nov. 26, 1994 [KR] Rep. of Korea ..................... 94-31319

[51] Int. Cl.$^6$ ............................. H03B 21/00; G06F 1/02
[52] U.S. Cl. ........................... 331/18; 327/107; 364/721; 364/718.01; 375/376; 331/25
[58] Field of Search .................................. 327/105, 106, 327/107; 331/18, 1 A, 42, 19, 25; 364/721, 718, 720; 341/147; 375/376

[56] References Cited

U.S. PATENT DOCUMENTS

| | | | |
|---|---|---|---|
| 4,965,533 | 10/1990 | Gilmore | 331/18 |
| 4,992,743 | 2/1991 | Sheffer | 327/106 |
| 5,028,887 | 7/1991 | Gilmore | 331/18 |
| 5,375,065 | 12/1994 | Owen | 327/107 X |
| 5,382,913 | 1/1995 | Carson et al. | 327/105 |

OTHER PUBLICATIONS

Seki, et al.: "High Resolution and Fast Frequency Settling PLL Synthesizer": pp. 115–120; NTT Radio Communication Systems Laboratories.

*Primary Examiner*—Robert Pascal
*Assistant Examiner*—Arnold Kinkead
*Attorney, Agent, or Firm*—Larson and Taylor

[57] ABSTRACT

A hybrid frequency synthesizer combining a direct frequency synthesizer and a PLL synthesizer are disclosed. The direct frequency synthesizer includes a first and second phase accumulator, the second phase accumulator inputting K/N phase data and operating at M times faster than the first phase accumulator, a 360 degree detector adding the outputs of the first and second phase accumulators and detecting a point in time at which the added values become 360 degrees, which point in time is provided to the initialization circuit. The initialization circuit initializes the state of the first and second phase accumulators and controls the output timing of the first phase accumulator so as to synthesize the next period of the output frequency at the initialized time. Accordingly, the present invention simplifies the construction, and is economical.

1 Claim, 2 Drawing Sheets

HYBRID FREQUENCY SYNTHESIZER

BACKGROUND OF THE INVENTION

The present invention relates to a frequency synthesizer, and more particularly, to a hybrid frequency synthesizer mixing a direct digital frequency synthesizer(DDS) and a phase locked loop(PLL) synthesizer in a wireless communication system.

FIG. 1 is a block diagram of the conventional hybrid frequency synthesizer.

Referring to FIG. 1, the conventional hybrid frequency synthesizer comprises a PLL B and a DDS A1. PLL B in the hybrid frequency synthesizer consists of a phase comparator 15 comparing a reference frequency and a frequency of a voltage controlled oscillator fed-back through N frequency divider and generating an error voltage corresponding to difference of phase and frequency, a low pass filter 16 for removing a fluctuation component of the error voltage, a voltage controlled oscillator 17 for changing an oscillating frequency according to a control voltage inputted through the low pass filter 16, and N frequency divider 18 for outputting 1/N signal frequency of signal frequency outputted from the voltage controlled oscillator 17.

Firstly, the phase comparator 15 compares an input reference frequency and the frequency of the voltage controlled oscillator oscillator 17, and N frequency divider becomes stable.

At this time, the output frequency of the voltage controlled oscillator is fixed to a specific frequency.

The conventional PLL frequency synthesizer fixes a reference frequency to a specific frequency, obtains an output frequency corresponding to N times of the reference frequency by changing a dividing ratio of the N frequency divider.

However, the hybrid frequency synthesizer of the DDS and the PLL changes a reference frequency provided from the DDS instead of changing the dividing ratio of the PLL in order to obtain the fine frequency resolution and fast setting time.

Referring to FIG. 1, the DDS A1 of the conventional hybrid frequency synthesizer consists of a phase accumulator 10 accumulating an instantaneous phase data K inputted as a digital type by each clock, a phase/amplitude converter 11 outputting a digital amplitude value of a sinewave with respect to the accumulated discrete phase value, a digital/analog converter 12 outputting an analog amplitude value of the sinewave, a low pass filter 13 removing harmonic components and sampling harmonic component of the analog amplitude value, and a limiter 14 converting the analog sine wave into a rectangular wave and providing the rectangular wave as a reference frequency of the PLL.

The operation of the DDS A1 used in the conventional hybrid frequency synthesizer will be described below.

The DDS A1 generates a sinewave, and converts the generated sinewave into a rectangular wave determined by the instantaneous phase data K, and provides the rectangular wave through a limiter to a reference frequency input terminal of the PLL synthesizer.

The DDS A1 is a method for accumulating an instantaneous phase value by each clock and synthesizing one period of the output frequency.

Accordingly, an arbitrary frequency is easily generated since the corresponding output frequency is generated each when the instantaneous phase value inputted as a type of a digital word is changed.

The output frequency of the DDS A1 forms one period each time the accumulated result of the phase accumulator overflows. Consequently, the most significant bit designates the output frequency.

However, the output of the most significant bit of the phase accumulator in the conventional DDS cannot be directly used as a reference frequency because it periodically changes its duty cycle, and generates jitters according to the input instantaneous phase value. So the hybrid synthesizer has a problem in that a spurious and phase noise level in the output of the PLL is increased when directly using the most significant bit as the reference frequency of the PLL.

Accordingly, the conventional hybrid frequency synthesizer depicted in FIG. 1 generates the reference frequency by converting the output of the phase accumulator to an analog sine wave in order to remove the jitter components with a phase/amplitude converter, a digital/analog converter, low pass filter, and a and finally obtains a rectangular reference frequency through the limiter. The limiter is placed between the DDS and the PLL in order to provide a rectangular reference frequency for the PLL. This is done by cutting out the amplitude fluctuation components on the synthesized sine wave of the DDS.

The above conventional method has drawbacks in that an expensive D/A converter and a low pass filter, a limiter, etc are needed, and the system becomes large.

SUMMARY OF THE INVENTION

It is an object of the present invention to provide an hybrid frequency synthesizer which directly uses the phase accumulator output signal of the DDS as a reference frequency of the PLL whereby the output waveform of the most significant bit of the phase accumulator always has a constant synthesizing period regardless of the input instantaneous phase value K. and the variation due to the jitter components and the duty ratio do not occur by adding a second phase accumulator, a 360 degree detector, and an initialization circuit incto the convention DDS while removing the analog building blocks such as a phase to amplitude converter, a D/A converter, a low pass filter, and a limiter.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
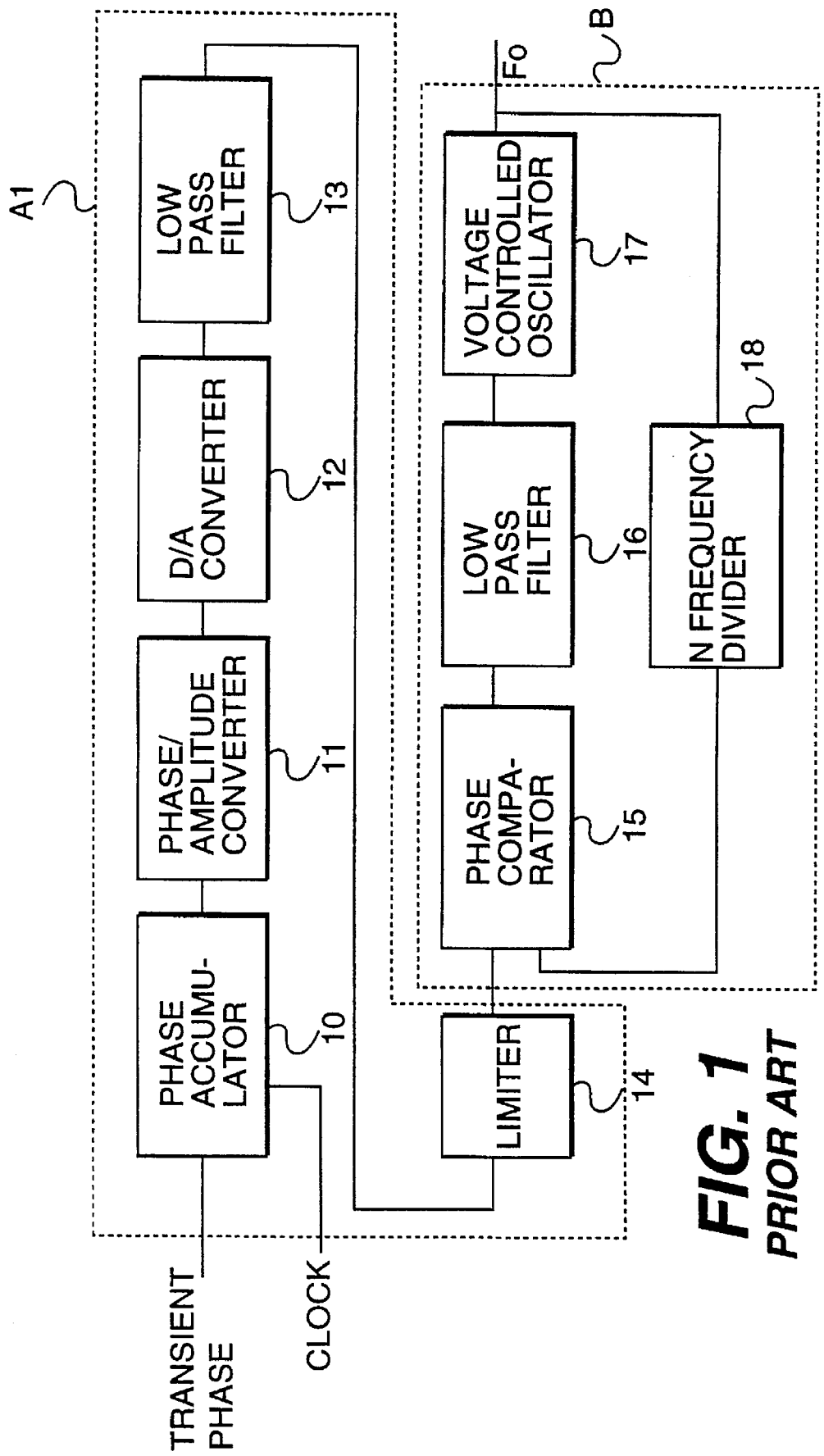
FIG. 1 is a block diagram of a conventional hybrid frequency synthesizer.
Figure 2:
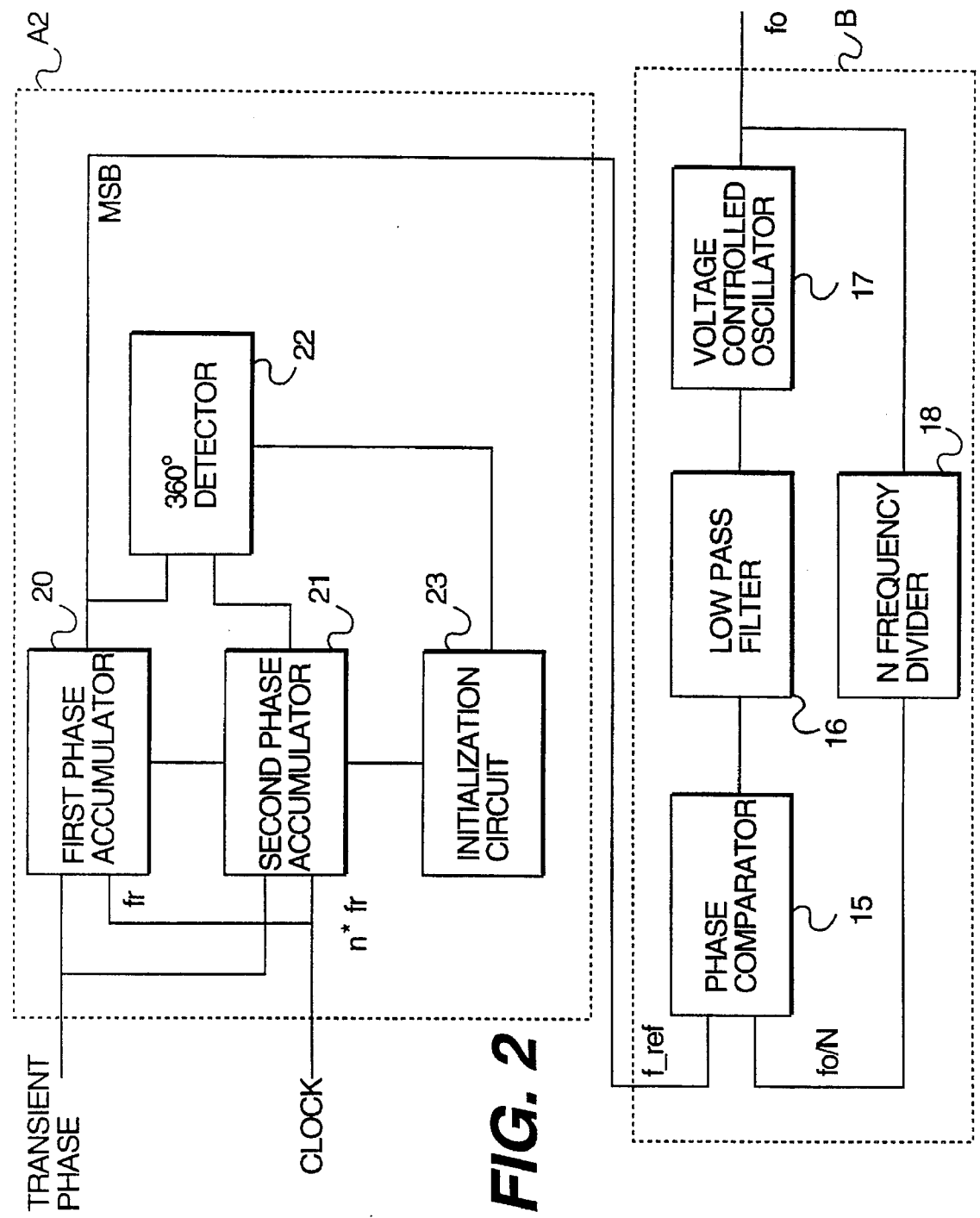
FIG. 2 is a block diagram of a hybrid frequency synthesizer according to the present invention.

Referring to FIG. 2, the construction of the PLL synthesizer is similar to that of the conventional hybrid synthesizer, except that the direct frequency synthesizer consists of a second phase accumulator 21 inputting K/M phase data and operating as M times faster than the first phase accumulator 20, a 360 degree detector 22 adding the outputs of the first and second phase accumulators 20, 21 and detecting a point of time at which the added value becomes 360° and providing the point of time for the initialization circuit, and an initialization circuit initializing the states of the first and second phase accumulators 20, 21 and controlling an output timing of the first phase accumulator so as to synthesize the next period of the output frequency at the initialized time, in addition to a first phase accumulator which is equivalent to the phase accumulator 10 of FIG. 1.

The operation of the hybrid frequency synthesizer according to the present invention will be described below.

In FIG. 2, the first phase accumulator accumulates an instantaneous phase data K inputted as a digital type each clock cycle as the phase accumulator of the conventional DDS.

At this time, K/M data is inputted to the second phase accumulator, the second phase accumulator operates as M times faster than the first phase accumulator.

The 360 degree detector adds the outputs of the first and the second phase accumulators, detects a point of time at which the sum of the two phase accumulators becomes 360 degrees, and provides the point of the initializing time for the initialization circuit.

The initialization circuit initializes state of the first and second phase accumulators at the point of time at which 360 degrees is detected in order to remove the residual phase components in the two phase accumulators, and controls an output timing of the first phase accumulator so as to generate an exact synthesizing period of the output refererence frequency by the most significant bit of the first phase accumulator.

According to the above operation, the variations of jitter of the first phase accumulator is removed. The most significant bit of the first accumulator can be directly used as the reference frequency of the PLL.

Accordingly, the present invention can simplify the device, is economical, and remove spurious and phase noise included in the output of the PLL, thereby improving performance of the hybrid frequency synthesizer.

What is claimed is:

1. A hybrid frequency synthesizer which includes a direct digital frequency synthesizer synthesizing a reference frequency and a phase locked loop synthesizer having a dividing ratio fixed as N, wherein said direct digital frequency synthesizer comprises:
a first phase accumulator;
a second phase accumulator inputting K/M phase data and operating at M times faster than said first phase accumulator, said first phase accumulator accumulating an instantaneous phase data K inputted as digital data;
a 360 degree detector adding the outputs of said first and second phase accumulators and detecting a point of time at which the added value becomes 360 degrees; and
an initialization circuit initializing the state of said first and second phase accumulators and controlling an output timing of said first phase accumulator so as to synthesize a next period of the output frequency at an initialized time.

* * * * *